(12) United States Patent
Schätzler et al.

(10) Patent No.: US 6,774,479 B2
(45) Date of Patent: Aug. 10, 2004

(54) ELECTRONIC DEVICE HAVING A SEMICONDUCTOR CHIP ON A SEMICONDUCTOR CHIP CONNECTION PLATE AND A METHOD FOR PRODUCING THE ELECTRONIC DEVICE

(75) Inventors: Bernhard Schätzler, Regensburg (DE); Georg Ernst, Thalmassing (DE); Tan Loon Lee, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/151,988

(22) Filed: May 21, 2002

(65) Prior Publication Data

US 2002/0192874 A1 Dec. 19, 2002

(30) Foreign Application Priority Data

May 21, 2001 (DE) ......................... 101 24 970

(51) Int. Cl.⁷ ............................................. H01L 23/48
(52) U.S. Cl. ................... 257/695; 257/692; 257/693; 257/730
(58) Field of Search ................... 257/692, 693, 257/695, 730

(56) References Cited

U.S. PATENT DOCUMENTS

| | | | |
|---|---|---|---|
| 5,497,032 A | | 3/1996 | Tsuji et al. ............... 257/710 |
| 5,592,020 A | | 1/1997 | Nakao et al. ............... 257/666 |
| 5,639,694 A | * | 6/1997 | Diffenderfer et al. ......... 29/827 |
| 5,801,440 A | * | 9/1998 | Chu et al. ................... 257/691 |
| 5,903,050 A | * | 5/1999 | Thurairajaratnam et al. ........................ 257/695 |
| 6,008,073 A | * | 12/1999 | King et al. ................. 438/123 |
| 6,326,678 B1 | * | 12/2001 | Karnezos et al. ........... 257/666 |
| 6,545,347 B2 | * | 4/2003 | McClellan ................. 257/690 |
| 6,552,417 B2 | * | 4/2003 | Combs ...................... 257/666 |

FOREIGN PATENT DOCUMENTS

| | | |
|---|---|---|
| EP | 0 706 213 A2 | 4/1996 |
| JP | 3-082 066 | 4/1991 |
| JP | 3-240 260 | 10/1991 |
| JP | 5-121 632 | 5/1993 |
| JP | 6-252 328 | 9/1994 |
| JP | 9-293 822 | 11/1997 |

* cited by examiner

*Primary Examiner*—Richard Elms
*Assistant Examiner*—Christian D. Wilson
(74) *Attorney, Agent, or Firm*—Laurence A. Greenberg; Werner H. Stemer; Gregory L. Mayback

(57) ABSTRACT

The invention relates to an electronic device having a semiconductor chip and a leadframe. The leadframe has a flat conductor frame. A semiconductor chip connection plate is configured in the center of the flat conductor frame. The semiconductor chip connection plate is structured by elongate openings all around the position of the semiconductor chip to form an island that carries the semiconductor chip and a ring that surrounds the island. Furthermore, the invention relates to a method for producing such an electronic device and to a corresponding leadframe.

51 Claims, 4 Drawing Sheets

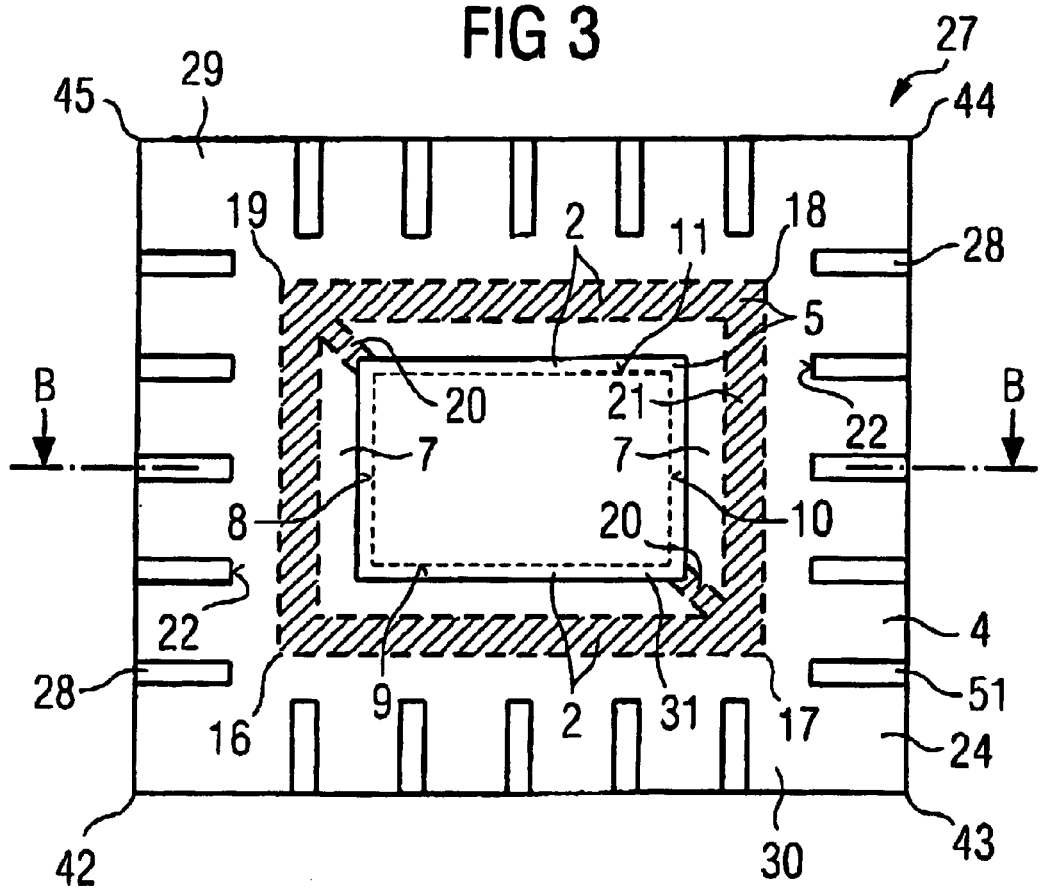
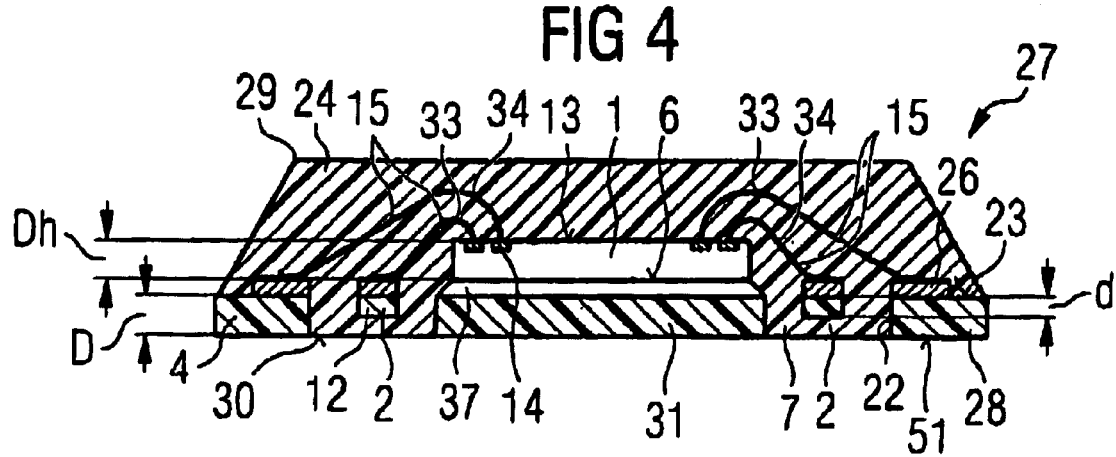

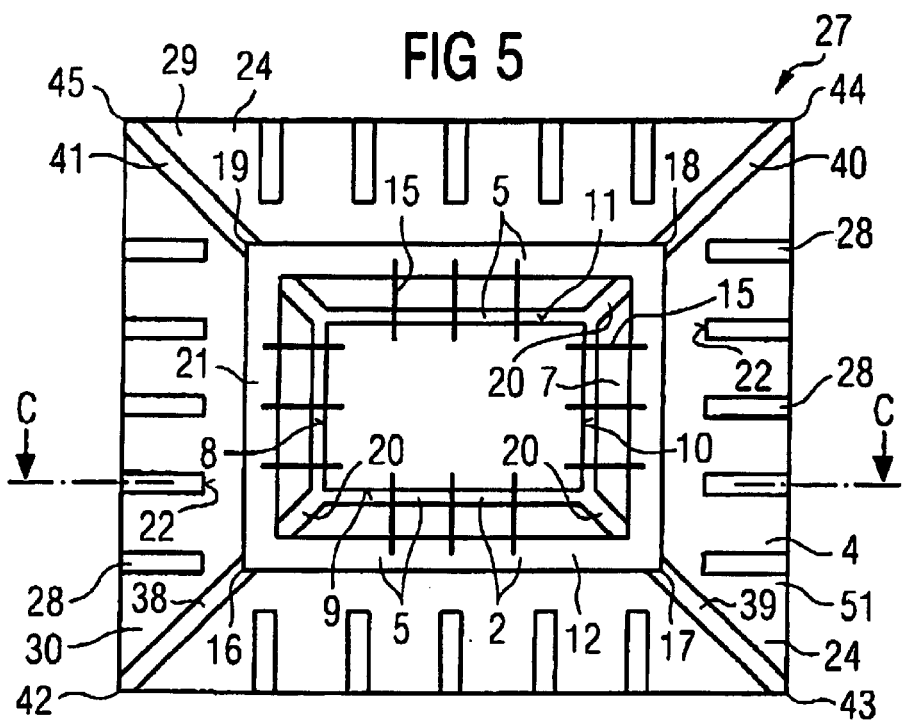
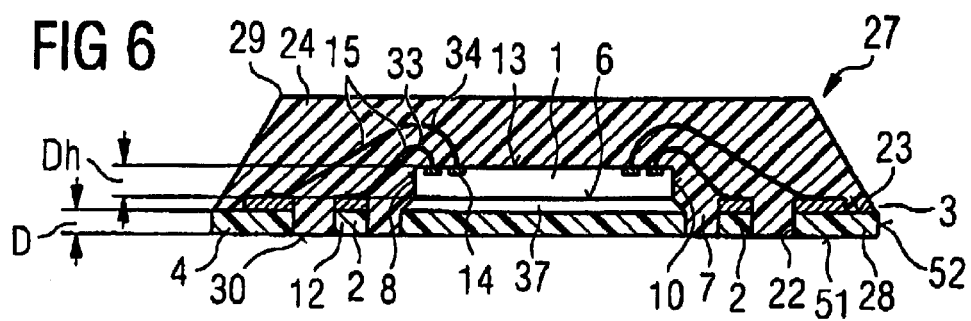
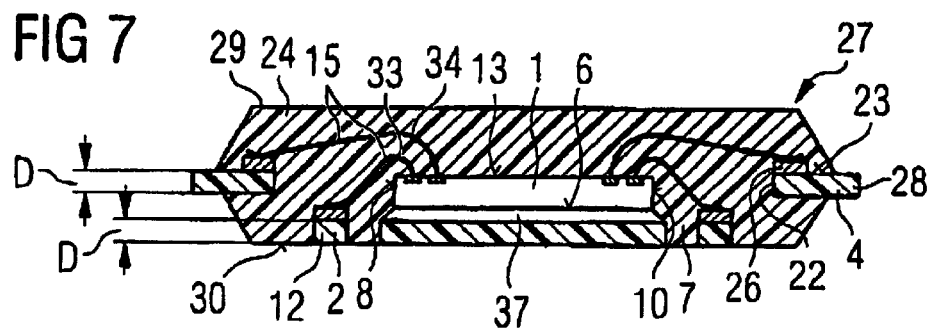

ELECTRONIC DEVICE HAVING A SEMICONDUCTOR CHIP ON A SEMICONDUCTOR CHIP CONNECTION PLATE AND A METHOD FOR PRODUCING THE ELECTRONIC DEVICE

BACKGROUND OF THE INVENTION

Field of the Invention

The invention relates to an electronic device having a semiconductor chip on a semiconductor chip connection plate, and to a leadframe having the semiconductor chip connection plate. The invention also relates to corresponding production methods.

If bond connections to a ground potential are additionally required by the semiconductor chip, it is possible to lead corresponding bonding wires from contact areas on the semiconductor chip, which are to be grounded, to the semiconductor chip connection plate. To that end, the semiconductor chip connection plate has a larger top side than the base area of the semiconductor chip. However, it is found that the reject rate is increased on statistical average by virtue of the fault rate in the case of devices with drawn-down additional ground lines to the semiconductor chip connection plate.

SUMMARY OF THE INVENTION

It is accordingly an object of the invention to investigate the cause of this increased reject rate and to avoid it to the greatest possible extent.

With the foregoing and other objects in view there is provided, in accordance with the invention, an electronic device having a semiconductor chip, a plastic housing and a leadframe for assembling the semiconductor chip. The semiconductor chip is mounted on a semiconductor chip connection plate of a flat conductor frame of the leadframe. The area of the semiconductor chip connection plate of the flat conductor frame is greater than the base area of the semiconductor chip. However, this larger semiconductor chip connection plate is structured in such a way that it has elongate openings along the edge sides of the semiconductor chip, so that the flat conductor frame has a ring that is defined by the elongate openings and that surrounds the semiconductor chip.

This electronic device has the advantage that the reject rate after the press molding of the plastic housing is lower than in previous constructions with a non-structured semiconductor chip connection plate having a larger top side than the base area of the semiconductor chip fitted thereon. Since the elongate openings surround the semiconductor chip, the bonded ground lines are arranged on the annular structure of the formed semiconductor chip connection plate. By virtue of the elongate openings between the ring structure and the semiconductor chip, the ring is mechanically decoupled from the semiconductor chip. Bond connections on the ring can shift with the ring and the pressed-on molding compound, with the result that the shear stress on the bond connection by the plastic molding compound during the press molding operation is reduced, and interruption or delamination of bond connections on the structured semiconductor chip connection plate is advantageously avoided in the region of the ring.

After the press molding operation, during the cooling of the plastic composition of the housing, the ring with the bond connections can follow the shrinking process of the plastic, with the result that the shear loads between the ring and the bond connection remain minimized in this phase as well. Without the invention's openings all around the semiconductor chip, the shear loads between the bond connections and the semiconductor chip connection plate are in some instances so high that the bond connections tear and malfunctions of the electronic device thus occur. This problem is solved by the invention's structuring of the semiconductor chip connection plate.

In order to ensure a ground line between the semiconductor chip connection plate and the surrounding ring—in one embodiment of the invention—at least one electrically conductive bridge is provided between the ring of the semiconductor chip connection plate and the region of the semiconductor chip connection plate on which the semiconductor chip is arranged. The bond connections are arranged spaced apart from the mechanical bridge on regions of the ring that are mechanically decoupled from the region that carries the semiconductor chip. Hereinafter the region of the semiconductor chip connection plate on which the semiconductor chip is fitted is referred to as the island region or the island while the region of the semiconductor chip connection plate that is of annular design is defined as ring.

By virtue of the mechanical decoupling of the ring, which has bond connections to the ground connection, from the island region with the semiconductor chip, this ring region can be shifted and moved more freely in the molding compound. Relative movements between the bond connection and the ring are minimized so that, in the event of thermal cycling, delamination of the bond connection on the ring is avoided, and consequently, there is a reduction in the rejects in particular during the soldering test and after thermal cycling for the device. Although hitherto delamination of the chip on the island has necessarily led to delamination of the bond connections on the semiconductor chip connection plate, this inevitable coupling is overcome by the invention's structuring of the semiconductor chip connection plate. In other words, even in the event of delamination of the chip in the island region, the ground connection is completely preserved via the bond connections and the ring, so that, after thermal cycling, the soldering and moisture test yields a significantly reduced reject rate.

In a further embodiment of the invention, the ring has a smaller thickness than the thickness of the island. Reducing the thickness of the ring reduces the stiffness thereof, and this minimizes the stresses, in particular shear stresses on account of relative movements between the island region of the molding compound and the ring with regard to the bond connection on the ring, and thus with regard to the ground line. Furthermore, on account of the smaller thickness of the ring, the ring with its bond connections can be completely embedded in the plastic compound. As a result, the region of the bond connections on the ring is better protected against mechanical stress including those from the outside, e.g. during the bending of the leadframe, during the cleaning of molding compound from the rear side or through stresses on account of the electronic device being pressed into a measurement receptacle, so that the reject rate which can occur during further processing likewise remains minimized.

A further embodiment of the invention provides for the semiconductor chip connection plate to be electrically connected to the ring and to be put at ground potential. To that end, provision is made of the mechanical bridge that connects the ring to the island.

A further embodiment of the invention provides for the semiconductor chip to have contact areas on its active top side. These contact areas are electrically connected to the ring via bond connections and are put at ground potential via the ring. Whereas on the island itself, the semiconductor chip with its passive rear side can be electrically connected to the island, and thus to ground potential directly by using a conductive adhesive or a soft solder, specific semiconductor structures on the active top side of the semiconductor chip cannot be connected directly to a ground potential. For these regions, corresponding contact areas are connected to the ring via bond connections, while the ring itself is in turn electrically grounded to the island using at least one electrically conductive mechanical bridge.

In one embodiment of the invention, therefore, it is provided that the ring is electrically connected to the semiconductor chip connection plate by at least one mechanical bridge located in the corner regions of the semiconductor chip connection plate. The bond connections are arranged in central regions of the elongate openings of the semiconductor chip connection plate. Providing the bond connections in the central regions of the elongate openings and fitting bridges only in the corner regions of the ring ensures mechanical decoupling of the central region of the ring, so that the bond connections in this region can be shifted in a relatively stress-free manner in the plastic housing.

A further embodiment of the invention provides for the ring to be electrically connected to the semiconductor chip connection plate by at least one mechanical bridge in its central regions. In this case, the bond connections are arranged in the corner regions of the semiconductor chip. This structuring of the semiconductor chip connection plate and the arrangement of the bond connections also means that the bond connections are fitted remote from the mechanical bridges. In this manner, the mechanical decoupling of the ring region in which the bond connections are situated reduces the shear stresses on the bond connections during thermal cycling and when plastic compound is pressed into the housing mold.

In a further embodiment of the invention, the flat conductor frame has flat conductor ends that are connected to contact areas on the semiconductor chip via bond connections. This second electrical path does not connect ground potential to the contact areas on the active top side of the semiconductor chip, but rather connects signal and supply lines to the semiconductor circuit on the active top side of the semiconductor chip. This electrical connection path is provided completely separately from the ground connection path using the ring. In combination with the ground connection via the ring, the flat conductor ends yield a complete supply for the integrated circuits on the active top side of the semiconductor chip and a complete access to the integrated circuits on the active top side of the semiconductor chip.

A further embodiment of the invention provides for the ring and the semiconductor chip connection plate to be offset in their height level by the thickness of the semiconductor chip relative to flat conductor ends. In this case, the semiconductor chip connection plate with the ring is arranged more deeply and the active top side of the semiconductor chip lies with its contact areas at the same height level as the top sides of the flat conductor ends. This embodiment of the invention also requires the bond connections to be drawn down from the top side of the semiconductor chip to the ring with the ground connection so that the bonding wires have to be fitted at different height levels. Nevertheless for the majority of the bonding wires that are to be connected to the flat conductor ends, an identical height level is produced, thus facilitating the production of the bond connections in this embodiment of the invention.

In a further embodiment of the invention, a difference between the thickness of the island and the thickness of the ring is realized by an etching-thin process. To that end, the regions of the leadframe that are not going to be etched thin can be covered, that is to say, in the island regions and the corresponding regions of the flat conductors, while the region of the ring and also the region of the bridges and the region of the flat conductor ends remain free and are exposed to an etching solution. This selective etching can actually be performed before the structuring of the flat conductor frame or of a leadframe strip. In a further step, the openings all around the region of the island and the openings between the flat conductors can be realized either by further selective etching or by stamping.

The etched-thin ring has the advantage that it can be completely embedded in a plastic compound in a preferred embodiment of the invention. To that end, the etching-thin process is carried out from the underside of the leadframe, and then during the introduction of the plastic compound, this etched-free region below the ring is then filled with plastic compound. In this case, the plastic compound can penetrate via the elongate openings to the underside of the ring and thus encloses the ring in plastic compound on all sides.

A further embodiment of the invention provides for the semiconductor chip and the semiconductor chip connection plate, with their side edges, to be surrounded on one side by a plastic molding compound. In this embodiment of the invention, the plastic compound is essentially applied from the top side of the leadframe strip, while the underside of the leadframe strip is provided with a supporting plate, so that no plastic is deposited on the underside of the island and the undersides of the flat conductors. Should plastic compound nevertheless penetrate to the underside of the island, then this portion of the plastic housing must be removed by complicated method steps in order to uncover the underside of the island and enable a ground connection. This ground connection can be effected by placing a conductive adhesive, for example, onto a metal area of a printed circuit board, or by soldering onto a metal area of a printed circuit board.

With the foregoing and other objects in view there is also provided, in accordance with the invention, a leadframe having a flat conductor frame. Such a leadframe is realized on a leadframe strip that receives both the individual semiconductor chips and the various bond connections. The leadframe has a semiconductor chip connection plate in its center. This semiconductor chip connection plate is structured, and has for its part, a ring connected to the semiconductor chip connection plate via at least one mechanical bridge. In this case, the semiconductor chip connection plate with its ring is provided for a ground connection. From the ring, it is possible to produce bond connections to the active top side of the semiconductor chip, while the passive rear side of the semiconductor chip lies on the top side of the semiconductor chip connection plate.

Such a leadframe has the advantage that, on the ring, as many bond connections as are desired can be accommodated as ground lines for the integrated circuits on the active top side of the semiconductor chip. By virtue of the mechanical decoupling of the ring from the semiconductor chip, the bond connections with the plastic molding compound can be shifted together with the ring, without shear stresses resulting in tearing between the bond connection and the ground connection.

In a further embodiment of the invention, in order to magnify the mechanical decoupling and to increase the elasticity of the ring, the leadframe has a ring with a smaller thickness than the thickness of the semiconductor chip connection plate in the region of the semiconductor chip. To that end, the semiconductor chip connection plate can be etched thin in the region of the ring. Both the semiconductor chip connection plate and the ring are electrically connected and grounded, with the result that the entire passive rear side of the semiconductor chip can be connected to ground. In addition, on the active top side of the semiconductor chip, selected regions can be connected to the ring of the leadframe via bond connections.

In one embodiment of the leadframe, the ring is electrically connected to the semiconductor chip connection plate by a mechanical bridge in the corner regions of the semiconductor chip connection plate. This embodiment has the advantage that the inherently stiff corner regions of the ring are now additionally utilized in order to fit the stiffening bridges there, so that the central region of the ring of this leadframe remains reserved for possible bond connections, which are then mechanically decoupled from the semiconductor chip.

In another embodiment of the invention, at least one mechanical bridge is arranged in a central region, so that the entire remaining region of the ring is available for bond connections. While the ring can be used to provide additional ground lines to the active top side of the semiconductor chip, signal access and supply lines are made available via the flat conductor ends of the flat conductor frame.

In a further embodiment of the invention, the flat conductor ends have a bondable layer for the possible bond connections. This bondable layer may be a silver layer or a gold layer or else a nickel layer or a layer made of alloys of these metals.

In a further embodiment of the invention, height or level of the ring and the remainder of the semiconductor chip connection plate are arranged offset relative to the height or level of the flat conductor ends of the flat conductor frame. By virtue of this offset arrangement, the semiconductor chip connection plate and the ring lies deeper than the top sides of the flat conductor ends. This facilitates the bonding connection of the flat conductor ends to the contact areas on the active top side of the semiconductor chip. The difficulties of the unequal level between top side of the semiconductor chip and the ground contact on the ring remain unchanged, however, when creating bond connections toward the ground potential.

With the foregoing and other objects in view there is provided, in accordance with the invention, a method for producing an electronic device having a semiconductor chip that is mounted on a semiconductor chip connection plate of a flat conductor frame of a leadframe. The flat conductor frame has a ring. The method includes the following steps:

providing a leadframe with a flat conductor frame in the center of which there is arranged a semiconductor chip connection plate whose top side area is greater than the base area of a semiconductor chip;

introducing elongate openings, which surround the base area of the semiconductor chip, into the semiconductor chip connection plate for the purpose of forming a ring;

applying a semiconductor chip to the semiconductor chip connection plate;

producing bond connections between the ring and the contact areas on the semiconductor chip;

producing bond connections as signal or supply lines between flat conductor ends and the contact areas on the active top side of the semiconductor chip; and packaging the flat conductor frame with the semiconductor chip into a plastic molding compound of a plastic housing while embedding the bond connections.

This method provides an electronic device that enables an improved production rate of fault-free devices to be obtained, since tearing of the ground lines on the semiconductor chip connection plate is reduced. This is because the ground lines in the form of bond connections are now effected on the structured semiconductor chip connection plate in a ring region and not on the island region on which the semiconductor chip is arranged.

In an exemplary implementation of the method a further method step is provided, in which the semiconductor chip connection plate is selectively etched thin in the region of the ring that will be formed. This selective etching is performed before the elongate openings are introduced. This etching-thin process can also be extended to the flat conductor ends of the flat conductor frame, with the result that, at the same time, thin flat conductor ends are also produced whose thickness corresponds to the thickness of the etched-thin ring. This etching-thin of the ring imparts a higher compliance to the ring. The result is that the shifts produced by thermal cycling, and in particular, during the process for pressing in the plastic molding compound of the housing can be absorbed without the occurrence of shear stress on the bond connection of the ring with the ground connection.

In a further embodiment of the invention, the etched-thin ring is completely embedded in a plastic compound. This has the advantage that the bond connections arranged on the ring are completely protected against being influenced and damaged. With the foregoing and other objects in view there is provided, in accordance with the invention, a further method for producing a leadframe with a flat conductor frame having a center formed with a semiconductor chip connection plate with a ring. The method has the following method steps:

providing a leadframe with a flat conductor frame in the center of which there is arranged a semiconductor chip connection plate whose top side area is greater than the base area of a semiconductor chip; and introducing elongate openings, which surround the base area of the semiconductor chip, into the semiconductor chip connection plate for the purpose of forming a ring while maintaining at least one mechanical bridge between the ring and the remaining semiconductor chip connection plate.

The production of such a lead frame has the advantage that the previously rigidly connected area providing two functions is now functionally and mechanically separated. First, a ground connection for the rear side of the semiconductor chip, and second the ground connection of the bond connections to the top side of the semiconductor chip are now functionally and mechanically separated. This produces an island for receiving the semiconductor chip and a ring— surrounding the island for receiving the bond connections through the structuring of the semiconductor chip connection plate. The requisite openings all around the island for the semiconductor chip can be introduced by using an etching operation. This etching operation can be effected wet-chemically or else by dry etching. A stamping possibility for structuring the semiconductor chip connection plate is also possible, but stamping yields smooth cutting areas, while in many applications it is advantageous to produce etched through openings since the etched profiles can be anchored better in the plastic compound of the housing.

In a further exemplary implementation of the method, the region of the flat conductor frame in which the ring will be formed is etched thin. This etching-thin of a region of the semiconductor chip connection plate can be effected before introducing the elongate openings. This has the advantage that the openings can be etched by merely penetrating through the residual thickness of the material of the semiconductor chip connection plate in order to form the ring. At the same time as the etching-thin of the region of the ring, a region of the flat conductor ends of the flat conductor frame can also be effected. As a result, the flat conductor ends also acquires a greater and higher elasticity, and consequently, their bond connections likewise achieve greater flexibility with respect to the loads due to the plastic molding compound or due to thermal cycling. Furthermore, it is possible to realize smaller distances between the flat conductor ends on account of the reduced thickness of the flat conductor ends.

To summarize, it can be stated that housings with an "exposed die pad" or an externally accessible semiconductor chip connection plate very often have a delamination between the plastic molding and the region of the semiconductor chip connection plate which is not covered by the chip. In other words, the delamination essentially relates to the bond connections that are additionally fitted on the large-area semiconductor chip connection plate. The uncovered region of the semiconductor chip connection plate is only encapsulated on one side by the plastic molding compound, and thus produces a mechanical stress on the bond connections arranged in this region, since a poor interfacial adhesion of the plastic molding compound occurs in this uncovered region of the semiconductor chip connection plate. As a result of the delamination of the plastic molding compound from the top side of the semiconductor chip connection plate in the uncovered region, the previously produced bond connections are sheared off on account of the high shear loading. Down bonds (bonding wire connection between the chip and the plate) and/or ground bonds (bonding wire connections between the plate and external flat conductors) are to be fitted on this, usually delaminated, part of the semiconductor chip connection plate. The delamination in this region, in conjunction with the thermal stresses occurring during soldering and/or during thermal cycling, leads to relative movements between the plate and the molding compound in all three spatial directions, so that this leads partially or completely to the tearing away of the bond connections on this plate. Since this delamination, in the case of down or ground bonds (drawn-down bond connections or ground lines), is a decisive criterion for reaching a specific soldering level during the so-called MSL test (moisture level test), housings with an "exposed die pad" and with semiconductor chips with ground bonds/down bonds enable only very poor soldering levels, particularly in the case of large housings, i.e. also large semiconductor chip connection plates.

A significant indication as to how it is possible to solve this problem of delamination, particularly in the MSL test and the associated high failure rate of the devices with a large semiconductor chip connection plate in relation to the base area of the semiconductor chip, is afforded by the bond connections with the flat conductor ends. By way of example, in a VQFN housing (very thin quadflat nonlead packages) the flat conductor connections likewise carry bond connections in the plastic molding compound, which are embedded completely independently of the flat conductor frame in the molding compound. These bond connections follow the movements of the molding compound during all thermal cycling processes and also during soldering as well as during the soldering and moisture test, without the occurrence of damage to the bond connections. It was during the observation of this phenomenon that the idea arose for solving the problem of the consequences of a delamination of the plastic compound on the uncovered semiconductor chip connection plate that must partly carry bond connections.

The invention's mechanical decoupling of the region of the semiconductor chip connection plate with the down bonds/ground bonds situated thereon from the island with the semiconductor chip, means that the endangered region with the down bonds/ground bonds can move more freely and with less hindrance in the molding compound, without relative movements occurring between down bonds/ground bonds and the inventive ring.

Furthermore, the mechanical decoupling of the down bond/ground bond region from the island with the semiconductor chip means that a delamination of the island region with the chip cannot inevitably lead to a delamination of the region with the down bonds and ground bonds.

If delamination of the region with the down bonds/ground bonds nevertheless occurs, this region can adapt itself to the movements of the molding compound. Stresses due to relative movements are thus reduced in the bond connection, and the down bonds/ground bonds are not damaged. "Half etching" (etching thin) to half of the thickness of the semiconductor chip connection plate in the region with the down bonds/ground bonds reduces the stiffness of the ring, and minimizes the stresses and also the relative movements between this ring and the molding compound.

The "half etching" of the region with the down bonds/ground bonds results in a complete encapsulation of this region with the molding compound during the packaging to form the electronic device. As a result, this region is significantly better protected against mechanical stress from outside, as occurs e.g. through bending of the lead frames, through deflashing (elimination of excess plastic molding compound) or through stress occurring during the introduction into a measurement receptacle. This in turn leads to the minimization of the loading on the sensitive down bonds/ground bonds.

"Double-ring plating" (double metal plating) of the "inner leads" (of the flat conductors) and of the ring with the down bonds, and dispensing with silver-plating of the island with the semiconductor chip make it possible to increase the molding compound adhesion on the actual semiconductor chip island especially as the introduced elongate openings also now completely encapsulate the semiconductor chip island laterally with the plastic molding compound. In this case, the position of the down bonds/ground bonds in the ring region can be chosen as desired, as long as a sufficient distance is maintained from the mechanical bridges between the ring and the semiconductor chip island. This leads to an improvement of the housing during the MSL test.

The advantage of the invention essentially consists in the fact that this new housing construction eliminates the critical, reliability-reducing fault mechanisms of tearing the down and ground bonds after an MSL test or TC loading (temperature cycle loading) by using the inventive flat conductor frame construction. This elimination is effected by mechanically decoupling the region with the down bonds/ground bonds from the island with the semiconductor chip. Simultaneous stress reduction and a better mechanical anchoring due to the "half etching" is also achieved.

Other features which are considered as characteristic for the invention are set forth in the appended claims.

Although the invention is illustrated and described herein as embodied in an electronic device having a semiconductor chip on a semiconductor chip connection plate and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic view of the underside of a second embodiment of the electronic device;

FIG. 4 is a diagrammatic cross-sectional view of the second embodiment of the electronic device electronic device taken along the line B—B in FIG. 3;

FIG. 5 is a diagrammatic view of the underside of a third embodiment of the electronic device;

FIG. 6 is a diagrammatic cross-sectional view of the third embodiment of the electronic device electronic device taken along the line C—C in FIG. 3;

FIG. 7 is a diagrammatic cross-sectional view of a fourth embodiment of the electronic device;

DESCRIPTION OF THE PREFERRED EMBODIMENTS

Figure 1:
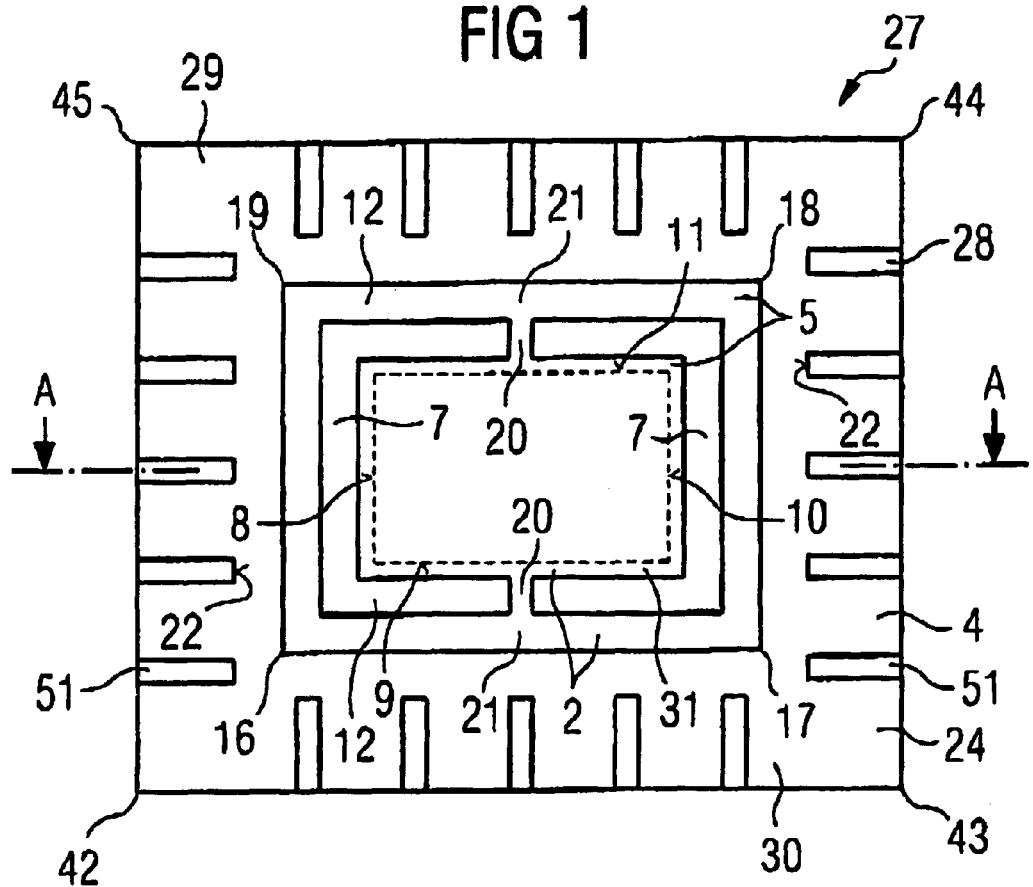
FIG. 1 is a diagrammatic view of the underside of a first embodiment of an electronic device.

Referring now to the figures of the drawing in detail and first, particularly, to FIG. 1 thereof, there is shown a diagrammatic view of the underside of a first embodiment of an electronic device 27. This embodiment is an example of a VQFN housing (very thin quadflat nonlead package) with an "exposed die pad" or a semiconductor chip connection plate 2 routed outward. The view of FIG. 1 shows the underside of this semiconductor chip connection plate 2, since the underside of this semiconductor chip connection plate 2 forms a part of the housing bottom 30 of the electronic device 27. In the embodiment shown in FIG. 1, this semiconductor chip connection plate 2 is structured in such a way that it has an island 31 in the center of the housing bottom 30. This island carries a semiconductor chip—which cannot be seen—in this diagrammatic view of the underside. Furthermore, the structured semiconductor chip connection plate 2 has a ring 12 that surrounds the island 31. The ring 12 is mechanically separated from the island 31 by elongate openings 7 along the edge sides 8, 9, 10 and 11 of the semiconductor chip.

In the central regions 21 of the ring 12 opposite the semiconductor chip edge sides 9 and 11, in this first embodiment of the invention, the structured semiconductor chip connection plate 2 has electrically conductive mechanical bridges 20, so that the island 31 and the ring 12 are at the same potential. This potential is the ground potential of an electronic circuit. Furthermore, flat conductors 28 are discernible on the underside of this embodiment of the invention. These flat conductors 28 are likewise arranged in a freely accessible manner in the housing bottom and can be contact-connected both from below and from the side. These flat conductors 28 are embedded in the plastic molding compound 24 (also see FIG. 2) of the plastic housing 29 with four side areas and are anchored on account of their etching profiling, while the underside 51 and an edge side area 52 (see FIG. 2) of the flat conductors 28 can be contact-connected externally.

The flat conductors 28 and also the structured semiconductor chip connection plate 2 are those regions of a lead frame (not shown) that have remained in the plastic molding compound 24. The lead frame has a flat conductor frame 3. The structuring of the semiconductor chip connection plate 2 into a ring 12 and an island 31 results in the mechanical decoupling of a part of the semiconductor chip connection plate 2, namely the ring region, from the region which carries the semiconductor chip, namely the island 31. What is thus made possible is that the ring 12, at the locations at which it is not connected to the island 31 by a mechanical bridge 20, can adapt itself to the movements of the plastic molding compound 24 during thermal cycling. Additional grounding or ground lines which are fitted inside the housing on the ring 12 are not loaded by shear stresses during expansion or compression of the plastic molding compound 24. A device that is constructed in this way and whose underside is shown in FIG. 1 consequently has smaller failures after an MSL test (moisture level test) in comparison with devices which have a non-structured semiconductor chip connection plate 2 with bond connections on the semiconductor chip connection plate 2.

Figure 2:
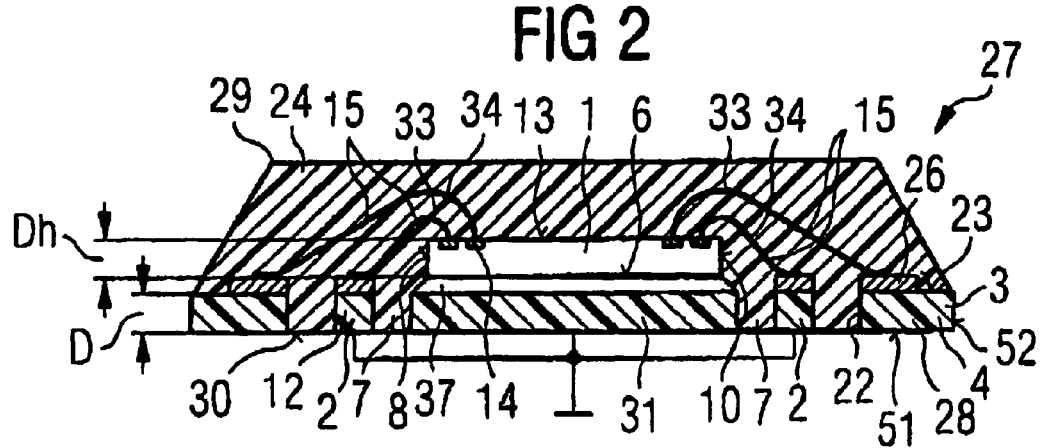
FIG. 2 is a diagrammatic cross-sectional view of the first embodiment of the electronic device electronic device taken along the line A—A in FIG. 1.

FIG. 2 shows a diagrammatic cross-sectional view of the first embodiment of the electronic device 27 taken along the line AA in FIG. 1. Components having the same functions as in FIG. 1 have been identified by the same reference symbols and are not explained separately.

In this embodiment of the invention, the plastic molding compound 24 is applied to the lead frame 4 on one side from above, so that the underside 51 of the flat conductors 28 and the underside of the structured semiconductor chip connection plate 2 remain free of plastic.

This diagrammatic cross section of FIG. 2 shows two types of bond connections 15. A first type of the bond connections 15 is signal and supply lines 33, which serve to conduct signals and a voltage supply and which lead from the top side 23 of the flat conductor ends 22 to contact areas 14 on the active top side 13 of the semiconductor chip 1. A second type of the bond connections 15 is ground lines 34, which lead from the grounded ring 12 to contact areas 14 on the semiconductor chip 1.

The ground lines 34 to the active top side 13 of the semiconductor chip 1 are required for specific integrated circuits on the active top side 13 of the semiconductor chip. In addition, the passive rear side of the semiconductor chip 1 is supplied with ground potential via a conductive layer 37 to the island 31, which is at the ground potential. The structuring of the semiconductor chip connection plate 2 into an island 31 carrying the semiconductor chip 1 and elongate openings 7 along the edges 8 and 10 of the semiconductor chip 1 in the semiconductor chip connection plate 2 results in mechanical decoupling of the ground lines 34 on the ring 12 from the island 31. Consequently, the regions of the ring 12 with ground lines 34 can adapt themselves to the movements and displacements of the plastic molding compound 24 during thermal cycling processes of the electronic device 27, without the bond connections in this region being exposed to shear stress.

FIG. 3 shows a diagrammatic view of the underside of a second embodiment of the electronic device 27. Components having the same functions as in FIGS. 1 and 2 are identified by the same reference symbols and are not explained separately.

The essential difference between the second embodiment shown in FIG. 3 and the first embodiment shown in FIG. 1 consists in the further or reinforced mechanical decoupling of the ring 12 from the island 31, by virtue of the fact that the ring 12 can no longer be seen on the underside of the electronic device 27, as is shown in FIG. 3. Therefore, the region of the ring 12 in FIG. 3 is only indicated by broken lines. A further difference between the second embodiment of the invention according to FIG. 3 and the first embodiment according to FIG. 1 is that the mechanical bridges 20 are not arranged in the central region of edge sides but rather in corner regions 17 and 19 of the ring 12. These bridges 20 also cannot be seen on the underside of the electronic device. This is achieved by etching thin the region of the ring 12 including the region of the mechanical bridges 20 before introducing the plastic molding compound 24 of the plastic housing 29 from the underside of the lead frame 4. Consequently, during the introduction of the plastic into the mold, the plastic molding compound can enclose the ring 12 completely with plastic. This second embodiment of the invention has the additional advantage that the ring region cannot be damaged by influences.

FIG. 4 shows a diagrammatic cross-sectional view of the second embodiment of the electronic device 27 taken along the line BB shown in FIG. 3. Components having the same functions as those in the preceding figures are identified by the same reference symbols and are not explained separately.

In the region of the ring 12, the semiconductor chip connection plate 2 has been etched down to a thickness d of the thickness D of the semiconductor chip connection plate 2. As a result the grounded ring 12 with its ground lines 34 is mechanically decoupled from the island 31 even further than is already the case in the first embodiment shown in FIG. 1. Consequently, the ring 12, with the ground line 34, can follow the thermal expansion behavior of the plastic compound during thermal cycling without a damaging effect on the ground line 34. The electronic device 27, and in particular, its ground lines 34 to the active top side 13 of the semiconductor chip 1 thus become more reliable and more secure, thereby reducing the failures during the MSL test.

FIG. 5 shows a diagrammatic view of the underside of a third embodiment of an electronic device 27. Components having the same functions as those in the preceding figures are identified by the same reference symbols and are not explained separately.

The essential difference between the third embodiment of the invention and the preceding embodiments consists in the fact that all four corner regions 16, 17, 18 and 19 of the ground ring 12 of the semiconductor chip connection plate 2 have mechanical bridges. Furthermore, flat strip bond connections 15 are arranged in the central regions 21 of the ground ring, which bridge the elongate openings 7. Finally, the mechanical bridges in the corner regions 16, 17, 18 and 19 are formed as ground connection contacts 38, 39, 40, 41 which can be contact-connected in the corners 42, 43, 44 and 45 of the electronic device 27. Between the ground connection contacts 38 to 41, as in the preceding embodiments, there are arranged flat conductors 28 as externally accessible connections at the side edges of the plastic housing 29.

FIG. 6 shows a diagrammatic cross-sectional view of the third embodiment of the electronic device 27 taken along the line C—C in FIG. 5. Components having the same functions as those in the preceding figures are identified by the same reference symbols and are not explained separately.

The cross-sectional view of the third embodiment does not differ from the cross-sectional view illustrated in FIG. 2, since here too, the structured semiconductor chip connection plate 2 is arranged on the underside of the electronic device 27 in the same plane as the flat conductors 28. In this form of the housing, the flat conductors 28 have an underside and a side area that simultaneously serve for external contact-connection.

FIG. 7 shows a diagrammatic cross-sectional view of a fourth embodiment of the electronic device 27. Components having the same functions as those in the preceding figures are identified by the same reference symbols and are not explained separately.

In the fourth embodiment of the invention shown in FIG. 7, the flat conductor ends 22 are completely embedded in the plastic molding compound 24 of the plastic housing 29. Moreover, the flat conductor ends 22 are not located in the same plane as the semiconductor chip connection plate 2. Rather, the semiconductor chip connection plate 2 is arranged deeper than the flat conductor ends 22 approximately by the thickness of the semiconductor chip 1. What is achieved with this embodiment is that the top sides 23 of the flat conductor ends 22 are at approximately the same height level as the active top side 13 of the semiconductor chip 1 with its contact areas 14, thereby facilitating the production of bond connections for signal and supply lines 33 to the flat conductor ends 22. However, the bond connections 15 to the ground ring 12 must be lowered in an unchanged manner since the ring occupies the same deeper level of the semiconductor chip connection plate 2 as the island 31 on which the semiconductor chip is arranged. Since, in this embodiment, the flat conductor ends 22 provide no external contact areas and are completely embedded in plastic, flat conductors 28 project laterally from the plastic housing 29.

Figure 8:
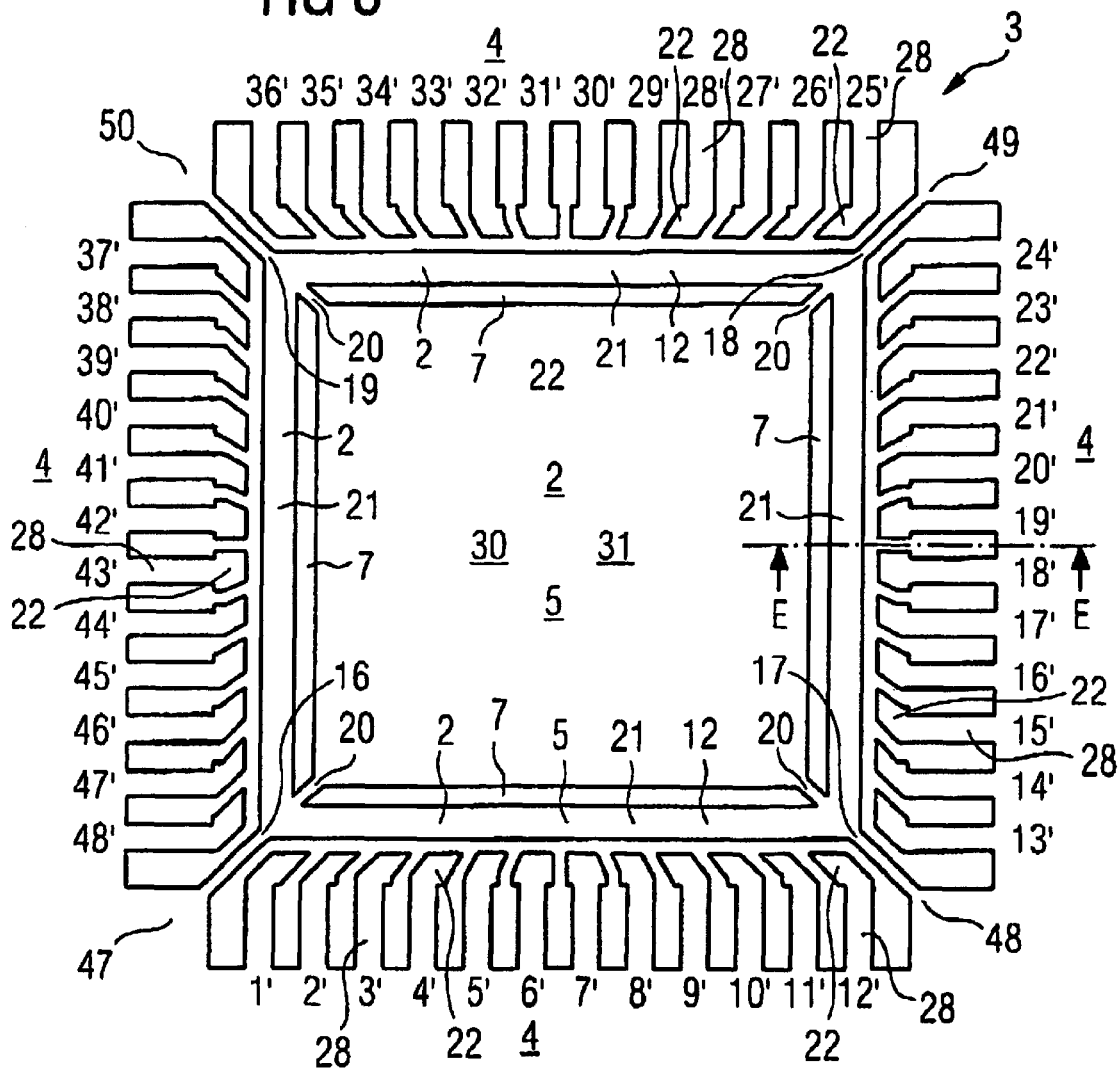
FIG. 8 is a diagrammatic plan view of a lead frame.

FIG. 8 shows a diagrammatic plan view of a leadframe 4. Components having the same functions as those in the preceding figures are identified by the same reference symbols and are not explained separately.

The leadframe 4 is constructed from a plurality of flat conductor frames 3. These flat conductor frames 3 have, in their center 25, a structured semiconductor chip connection plate 2 which has elongate openings 7 at the edges of an island 31, so that the island 31 is surrounded by a ring 12 having corner regions 16, 17, 18 and 19 with mechanical bridges 20 to the island 31. Furthermore, external contact areas 47, 48, 49 and 50 are provided in corner regions 16, 17, 18 and 19 and can be connected to the grounded ring 12 and the island 31. This embodiment of the lead frame 4 has the advantage that grounding of the structured semiconductor chip connection plate 2 becomes possible via the external contact areas 47 to 50. As a result, this lead frame is suitable for offering 48 signal and voltage supply connections via 48 flat conductors (from 1' to 48') and further for providing 4 ground connections via the external contact areas 47 to 50. Furthermore, in the central regions 21 of the ring 12, it is possible to provide ground lines to a semiconductor chip accommodated on the island 31. The ground lines are mechanically decoupled from the island 31 so that these central regions 21 of the ring 12 can adapt themselves to the expansion behavior of the plastic compound of the housing.

Figure 9:
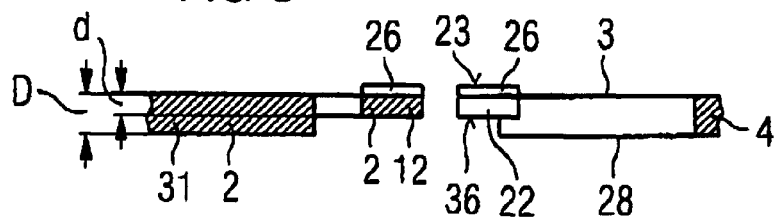
FIG. 9 is a diagrammatic cross-sectional view of a part of the lead frame shown in FIG. 8, and is taken along the line E—E in FIG. 8.

FIG. 9 shows a diagrammatic cross-sectional view of a part of the lead frame of FIG. 8 taken along the line E—E in FIG. 8. Components having the same functions as those in the preceding figures are identified by the same reference symbols and are not explained separately.

This diagrammatic cross-sectional view shows that in this embodiment, provision is made for etching thin the ring 12 and also the flat conductor ends 22, in order to ensure further mechanical decoupling of the central region of the ring 12 and also of the flat conductor ends 22 from the island region of the lead frame 4. The cross-sectional view of FIG. 9 shows that the thickness d of the ring 12 and of the flat conductor ends 22 is less than the thickness D of the island 31. Furthermore, in FIG. 9, a bondable coating 26 is arranged both on the top side 23 of the flat conductor ends 22 and on the top side of the ring 12 in order to increase the bonding capability of these regions. Smaller distances between the flat conductor ends can be realized by virtue of the flat conductor ends being etched thin.

In a method for producing a lead frame, a plurality of method steps are provided. First, a lead frame is provided which has at least one flat conductor frame. Arranged in the center of this flat conductor frame is a semiconductor chip connection plate 2 whose top side is larger than the base area of a semiconductor chip 1. Elongate openings 7 are introduced into this semiconductor chip connection plate 2 and surround the base area of the semiconductor chip. In this case, a ring 12 is formed which surrounds an island 31 on which the semiconductor chip 1 can be positioned.

Using at least one mechanical bridge 20, the ring 12 and the island 31 are electrically connected to one another and can be electrically connected to a ground. The elongate openings can be introduced at the same time as the flat conductors are introduced into a lead frame strip. During this structuring of the lead frame strip to form individual flat conductor frames, it is also possible, in the region of the ring 12 and of the flat conductor ends 22, to etch thin the material from the underside of the lead frame strip, so that a reduced thickness d is produced in this region. The reduced thickness d also improves the possibility of realizing small distances of between 100 and 200 $\mu$m between the individual flat conductor ends 22 by etching. During this etching-thin process, the thickness D of the lead frame strip is etched thin to about half the thickness D of the lead frame strip 4 in the region of the ring 12 and of the flat conductor ends 22. In this embodiment of the invention, the thickness D of the lead frame strip is 200$\mu$ and can be set between 100 and 500 $\mu$m depending on the requirement imposed on the stability of the flat conductor frame.

We claim:

1. An electronic device, comprising:
   a plastic housing;
   a leadframe having a flat conductor frame with a center;
   a semiconductor chip connection plate located in said center of said flat conductor frame of said leadframe, said semiconductor chip connection plate having a thickness; and
   a semiconductor chip mounted on said semiconductor chip connection plate;
   said semiconductor chip having a base area and side edges;
   said semiconductor chip connection plate having an area being greater than said base area of said semiconductor chip;
   said semiconductor connection plate formed with elongate openings along said side edges of said semiconductor chip;
   said flat conductor frame having a ring defined by said elongate openings;
   said ring surrounding said semiconductor chip;
   said ring having a thickness smaller than said thickness of said semiconductor chip connection plate; and
   said ring being completely embedded in a plastic molding compound.

2. The electronic device according to claim 1, wherein: said semiconductor chip connection plate is electrically connected to said ring and has a ground potential.

3. The electronic device according to claim 1, comprising:
   at least one bond connection;
   said semiconductor chip having an active top side with contact areas; and
   said contact areas of said semiconductor chip being electrically connected to said ring by said at least one bond connection and having a ground potential.

4. The electronic device according to claim 1, comprising:
   at least one mechanical bridge;
   said ring having corner regions;
   said mechanical bridge being located in one of said corner regions and electrically connecting said ring to said semiconductor chip connection plate; and
   said ring having central regions with bond connections.

5. The electronic device according to claim 1, comprising:
   at least one mechanical bridge;
   said ring having side regions;
   said mechanical bridge being located in one of said side regions and electrically connecting said ring to said semiconductor chip connection plate; and
   said ring having corner regions with bond connections.

6. The electronic device according to claim 1, comprising:
   bond connections;
   said semiconductor chip having contact areas; and
   said flat conductor frame having flat conductor ends connected to said contact areas of said semiconductor chip by said bond connections.

7. The electronic device according to claim 6, wherein:
   said semiconductor chip has a thickness and an active top side;
   said flat conductor ends have a top side;
   said ring and said semiconductor chip connection plate have a height level that is offset by said thickness of said semiconductor chip relative to said flat conductor ends so that said semiconductor chip connection plate and said ring are configured deeper; and
   said active top side of said semiconductor chip and said contact areas lie at a height level and said top side of said flat conductor ends also lie at said height level.

8. The electronic device according to claim 1, wherein said semiconductor chip connection plate is mechanically decoupled from said ring.

9. The electronic device according to claim 1, wherein said ring is etched thin.

10. The electronic device according to claim 1, wherein:
    said ring has bond connections; and
    said bond connections are completely embedded in said plastic molding compound.

11. A leadframe, comprising:
    a flat conductor frame having a center with a semiconductor chip connection plate, said semiconductor chip connection plate having a thickness;
    a ring; and at least one mechanical bridge connecting said ring to said semiconductor chip connection plate;

said ring and said semiconductor chip connection plate being provided for a connection to a ground potential;

said ring having a thickness smaller than said thickness of said semiconductor chip connection plate.

12. The leadframe according to claim 11 wherein said semiconductor chip connection plate is electrically connected to said ring and is grounded.

13. The leadframe according to claim 11, wherein:

said ring has corner regions; and said mechanical bridge is located in one of said corner regions of said ring and electrically connects said ring to said semiconductor chip connection plate.

14. The leadframe according to claim 11, wherein:

said ring has central regions; and said mechanical bridge is located in one of said central regions of said ring and electrically connects said ring to said semiconductor chip connection plate.

15. The leadframe according to claim 11, wherein: said flat conductor frame has flat conductor ends with a bondable coating.

16. The leadframe according to claim 15, wherein:

said ring and said semiconductor chip connection plate have a height level that is offset relative to said flat conductor ends so that said semiconductor chip connection plate and said ring are configured deeper than said flat conductor ends.

17. The leadframe according to claim 11, wherein said semiconductor chip connection plate is mechanically decoupled from said ring.

18. The leadframe according to claim 11, wherein said ring is etched thin.

19. The leadframe according to claim 11, wherein said ring has a ring thickness enabling said ring to be completely embedded in a plastic molding compound.

20. The leadframe according to claim 11, further comprising:

a plurality of flat conductor ends surrounding said ring; and said plurality of flat conductor ends having a thickness smaller than said thickness of said semiconductor chip connection plate.

21. An electronic device, comprising:

a plastic housing;

a leadframe having a flat conductor frame with a center;

a semiconductor chip connection plate located in said center of said flat conductor frame of said leadframe; and a semiconductor chip mounted on said semiconductor chip connection plate;

said semiconductor chip having a base area and side edges;

said semiconductor chip connection plate having an area being greater than said base area of said semiconductor chip;

said semiconductor connection plate formed with elongate openings along said side edges of said semiconductor chip;

said flat conductor frame having a ring defined by said elongate openings;

said ring surrounding said semiconductor chip; and two mechanical bridges electrically connecting said ring to said semiconductor chip connection plate.

22. The electronic device according to claim 21, wherein:

said ring has corner regions;

said mechanical bridge is located in one of said corner regions; and said ring has central regions with bond connections.

23. The electronic device according to claim 21, wherein:

said ring has side regions;

said mechanical bridge is located in one of said side regions; and said ring has corner regions with bond connections.

24. The electronic device according to claim 21, wherein:

said semiconductor chip connection plate has a thickness; and said ring has a thickness smaller than said thickness of said semiconductor chip connection plate.

25. The electronic device according to claim 21, wherein: said semiconductor chip connection plate is electrically connected to said ring and has a ground potential.

26. The electronic device according to claim 21, further comprising:

at least one bond connection;

said semiconductor chip having an active top side with contact areas; and said contact areas of said semiconductor chip being electrically connected to said ring by said at least one bond connection and having a ground potential.

27. The electronic device according to claim 21, further comprising:

bond connections;

said semiconductor chip having contact areas; and said flat conductor frame having flat conductor ends connected to said contact areas of said semiconductor chip by said bond connections.

28. The electronic device according to claim 27, wherein:

said semiconductor chip has a thickness and an active top side;

said flat conductor ends have a top side;

said ring and said semiconductor chip connection plate have a height level offset by said thickness of said semiconductor chip relative to said flat conductor ends causing said semiconductor chip connection plate and said ring to be configured deeper; and said active top side of said semiconductor chip and said contact areas lie at a height level and said top side of said flat conductor ends also lie at said height level.

29. The electronic device according to claim 21, wherein said semiconductor chip connection plate is mechanically decoupled from said ring.

30. The electronic device according to claim 21, wherein said ring is etched thin.

31. The electronic device according to claim 21, wherein:

said ring has bond connections; and said bond connections are completely embedded in a plastic molding compound.

32. An electronic device, comprising:

a plastic housing;

a leadframe having a flat conductor frame with a center;

a semiconductor chip connection plate located in said center of said flat conductor frame of said leadframe; and a semiconductor chip mounted on said semiconductor chip connection plate;

said semiconductor chip having a base area and side edges;

said semiconductor chip connection plate having an area being greater than said base area of said semiconductor chip;

said semiconductor connection plate formed with elongate openings along said side edges of said semiconductor chip;

said flat conductor frame having a ring defined by said elongate openings;

said ring surrounding said semiconductor chip;

a plurality of flat conductor ends surrounding said ring;

said semiconductor chip connection plate having a thickness;

said ring having a thickness smaller than said thickness of said semiconductor chip connection plate; and said plurality of flat conductor ends having a thickness smaller than said thickness of said semiconductor chip connection plate.

33. The electronic device according to claim 32, wherein: said semiconductor chip connection plate is electrically connected to said ring and has a ground potential.

34. The electronic device according to claim 32, further comprising:

at least one bond connection;

said semiconductor chip having an active top side with contact areas; and said contact areas of said semiconductor chip being electrically connected to said ring by said at least one bond connection and having a ground potential.

35. The electronic device according to claim 32, further comprising:

at least one mechanical bridge;

said ring having corner regions;

said mechanical bridge being located in one of said corner regions and electrically connecting said ring to said semiconductor chip connection plate; and said ring having central regions with bond connections.

36. The electronic device according to claim 32, further comprising:

at least one mechanical bridge;

said ring having side regions;

said mechanical bridge being located in one of said side regions and electrically connecting said ring to said semiconductor chip connection plate; and said ring having corner regions with bond connections.

37. The electronic device according to claim 32, further comprising:

bond connections;

said semiconductor chip having contact areas; and said flat conductor frame having flat conductor ends connected to said contact areas of said semiconductor chip by said bond connections.

38. The electronic device according to claim 37, wherein:

said semiconductor chip has a thickness and an active top side;

said flat conductor ends have a top side;

said ring and said semiconductor chip connection plate have a height level offset by said thickness of said semiconductor chip relative to said flat conductor ends causing said semiconductor chip connection plate and said ring to be configured deeper; and said active top side of said semiconductor chip and said contact areas lie at a height level and said top side of said flat conductor ends also lie at said height level.

39. The electronic device according to claim 32, wherein said semiconductor chip connection plate is mechanically decoupled from said ring.

40. The electronic device according to claim 32, wherein said ring is etched thin.

41. The electronic device according to claim 32, wherein:

said ring has bond connections; and said ring and said bond connections are completely embedded in a plastic molding compound.

42. A leadframe, comprising:

a flat conductor frame having a center with a semiconductor chip connection plate;

a ring; and two mechanical bridges electrically connecting said ring to said semiconductor chip connection plate;

said ring and said semiconductor chip connection plate being provided for a connection to a ground potential.

43. The leadframe according to claim 42, wherein:

said semiconductor chip connection plate has a thickness;

said ring has a thickness smaller than said thickness of said semiconductor chip connection plate;

a plurality of flat conductor ends surround said ring; and said plurality of flat conductor ends have a thickness smaller than said thickness of said semiconductor chip connection plate.

44. The leadframe according to claim 42, wherein said semiconductor chip connection plate is electrically connected to said ring and is grounded.

45. The leadframe according to claim 42, wherein:

said ring has corner regions; and said mechanical bridge is located in one of said corner regions of said ring and electrically connects said ring to said semiconductor chip connection plate.

46. The leadframe according to claim 42, wherein:

said ring has central regions; and said mechanical bridge is located in one of said central regions of said ring and electrically connects said ring to said semiconductor chip connection plate.

47. The leadframe according to claim 42, wherein said flat conductor ends have a bondable coating.

48. The leadframe according to claim 42, wherein:

said ring and said semiconductor chip connection plate have a height level offset relative to said flat conductor ends causing said semiconductor chip connection plate and said ring to be configured deeper than said flat conductor ends.

49. The leadframe according to claim 42, wherein said semiconductor chip connection plate is mechanically decoupled from said ring.

50. The leadframe according to claim 42, wherein said ring is etched thin.

51. The leadframe according to claim 42, wherein said ring has a ring thickness enabling said ring to be completely embedded in a plastic molding compound.

* * * * *